US009461168B1

United States Patent
Ok et al.

(10) Patent No.: US 9,461,168 B1
(45) Date of Patent: Oct. 4, 2016

(54) CHANNEL STRAIN AND CONTROLLING LATERAL EPITAXIAL GROWTH OF THE SOURCE AND DRAIN IN FINFET DEVICES

(71) Applicant: International Business Machines Corporation, Armonk, NY (US)

(72) Inventors: Injo Ok, Loudonville, NY (US); Balasubramanian Pranatharthiharan, Watervliet, NY (US); Soon-cheon Seo, Glenmont, NY (US); Charan Veera Venkata Satya Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/046,559

(22) Filed: Feb. 18, 2016

Related U.S. Application Data

(63) Continuation of application No. 14/953,851, filed on Nov. 30, 2015.

(51) Int. Cl.
*H01L 29/78* (2006.01)
*H01L 29/66* (2006.01)

(52) U.S. Cl.
CPC ..... *H01L 29/7843* (2013.01); *H01L 29/66795* (2013.01); *H01L 29/7848* (2013.01)

(58) Field of Classification Search
CPC ................... H01L 29/7843; H01L 29/66795; H01L 29/7848
See application file for complete search history.

(56) References Cited

U.S. PATENT DOCUMENTS

| 7,671,418 B2 | 3/2010 | Topaloglu |
| 2015/0243784 A1 | 8/2015 | Morin |
| 2015/0380557 A1 | 12/2015 | Le et al. |

*Primary Examiner* — William Coleman
(74) *Attorney, Agent, or Firm* — Adolph Bohstedt

(57) ABSTRACT

A multi-gate finFET structure and formation thereof. The multi-gate finFET structure has a first gate structure that includes an inner side and an outer side. Adjacent to the first gate structure is a second gate structure. The inner side of the first gate structure faces, at least in part, the second gate structure. A stress-inducing material fills a fin cut trench that is adjacent to the outer side of the first gate structure. An epitaxial semiconductor layer fills, at least in part, an area between the first gate structure and the second gate structure.

1 Claim, 7 Drawing Sheets

CHANNEL STRAIN AND CONTROLLING LATERAL EPITAXIAL GROWTH OF THE SOURCE AND DRAIN IN FINFET DEVICES

BACKGROUND OF THE INVENTION

The present invention relates generally to the field of semiconductor structures, and more particularly to the retention of strain and the control of germanium epitaxial growth thickness on FinFET device channels.

A pure semiconductor is a poor electrical conductor as a consequence of having just the right number of electrons to completely fill its valence bonds. Through various techniques (e.g. doping or gating), the semiconductor can be modified to have an excess of electrons (becoming an n-type semiconductor) or a deficiency of electrons (becoming a p-type semiconductor). In both cases, the semiconductor becomes much more conductive (the conductivity can be increased by one million-fold or more). Semiconductor devices exploit this effect to shape electrical current. The study of semiconductor materials is an important area of material science research due to their application in devices such as transistors and therefore computers.

The most commonly used semiconductor materials are crystalline inorganic materials, which are classified according to the periodic table groups of their constituent atoms and also whether they are composed of a single element or more than one element.

Field-effect transistors (FETs) are transistors that employ an electric field to control the conductivity of a channel in which one of the two types of charge carriers may travel. A FET is composed of a source and a drain connected by the channel through which the charge carriers, electrons or holes, pass when voltage is applied to a gate. The gate sits over the channel separated by an insulating material referred to as the gate dielectric. Applying voltage to the gate changes the amount of charge carriers in the channel thereby controlling the current in the device.

The term FinFET describes a non-planar, trigate transistor built on a silicon-on-insulator (SOI) or bulk silicon substrate. The distinguishing characteristic of the FinFET is that the conducting channel is a silicon or silicon germanium "fin", which forms the body of the device. The wrap-around gate-over-fin channel structure provides better electrical control over the channel and thus helps in reducing the leakage current and overcoming other short-channel effects.

Charge carrier transport that is typically described by mobility through FET channels is an important factor for optimal performance. One way charge carrier transport can be modulated is through strain. For example, strained channels have been successfully integrated into Si- and Ge-based metal oxide semiconductor FETs (MOSFETs) to enhance carrier mobility.

SUMMARY

According to one embodiment of the present disclosure, a structure comprising a multi-gate finFET structure. The multi-gate finFET structure includes a first gate structure that includes an inner side and an outer side. Adjacent to the first gate structure is a second gate structure. The inner side of the first gate structure faces, at least in part, the second gate structure. A stress-inducing material fills a fin cut trench that is adjacent to the outer side of the first gate structure. An epitaxial semiconductor layer fills, at least in part, an area between the first gate structure and the second gate structure.

According to one embodiment of the present disclosure, a method of forming a multi-gate finFET structure is provided. The method including depositing a stress-inducing material into a fin cut trench that is adjacent to an outer side of a first gate structure such that a channel, which is controlled by the first gate structure, has a first amount of strain. The stress-inducing material fills a majority of the fin cut trench, wherein the stress-inducing material includes one or more of: a stress nitride layer, a tensile silicon nitride layer and a compressive silicon nitride layer. The channel includes one or more of: silicon, an alloy of silicon-germanium, a III-V compound semiconductor, and a II-VI compound semiconductor. Growing an epitaxial semiconductor layer between the first gate structure and a second gate structure, wherein the first amount of strain is increased to a second amount of strain as a result of the growth of the epitaxial semiconductor layer. The epitaxial semiconductor layer is a silicon-germanium layer, wherein each of the first and second gate structures are one of: a sacrificial gate or a true gate, and wherein the first and second gate structures include silicon, doped polysilicon with metal silicide, tungsten, titanium, tantalum, aluminum, nickel, ruthenium, palladium, platinum, tungsten nitride, aluminum nitride, titanium nitride, tungsten silicide, nickel silicide, and titanium silicide. Forming the first gate structure, wherein the first gate structure includes an inner side and the outer side. Forming a second gate structure that is adjacent to the first gate structure such that the inner side of the first gate structure faces, at least in part, the second gate structure. Forming the fin cut trench that is adjacent to the outer side of the first gate structure. Forming the epitaxial semiconductor layer such that the epitaxial semiconductor layer fills, at least in part, an area between the first gate structure and the second gate structure. Depositing a MOL ILD layer on an intermediate of the multi-gate finFET structure, wherein the MOL ILD layer is one or both of: silicon dioxide and a low-κ dielectric material. Controlling lateral source drain epitaxial growth of the epitaxial semiconductor layer.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
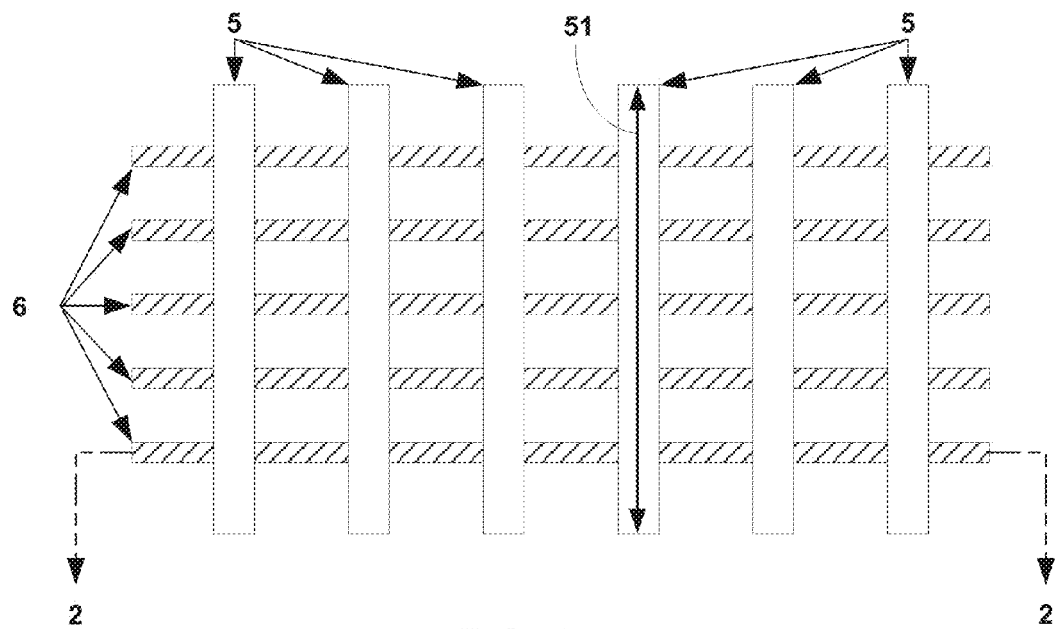
FIG. 1 illustrates a top-down view depicting a structure that includes fins and gate structures, in accordance with an exemplary embodiment of the present invention.

Strain is used in FET channel design in order to increase both electron and hole mobility, which leads to improved chip performance. Strain occurs when lattice mismatching is induced by the epitaxial growth of a first semiconductor material onto a second semiconductor material with a different composition of matter than the first semiconductor material. In the case of finFET design, channel strain is induced by the epitaxial growth of different alloys of silicon germanium on top of each other. However, the strain that is created from the epitaxial layer growth is often lost after the end fin cut in the fin process module, which is performed prior to gate formation. In some cases, the strain loss is 30-50%. In addition to the issue of strain loss, excessive lateral source-drain epitaxial growth can cause shorts between the negative field-effect transistor (NFET) fin and the positive field-effect transistor (PFET) fin devices in the static random access (SRAM) area. It is challenging to control the lateral epitaxial growth for the gate pitch less than 64 nm.

As shown in FIGS. 1-12, embodiments of the present invention recognize that a plurality of fins and corresponding gate structures are created in some FinFET devices such that these structures are joined to each other either directly or indirectly via a common component. In the embodiments shown in FIGS. 1-12, a plurality of fins are shown as being joined to each other via gate structures. As used herein an end fin cut refers to the removal of material that is adjacent to, but may not be directly abutting, an end gate structure. An end gate structure refers to a gate structure in a multi-gate finFET structure, wherein the end gate structure has an adjacent gate structure that faces an inner side of the end gate structure and a future or present termination (i.e., "cut") of one or both of a fin structure and other structures on an outer side of the end gate structure that does not face another gate structure. See the description of FIG. 2 for a further detailed explanation.

One skilled in the art is aware that a fin may have one or more layers of material that cover a portion of the fin and are intervening between the fin and the material that is removed, i.e. cut. An example of such a "cut" process is illustrated in at least FIG. 5, and is described in further detail herein. Embodiments of the present invention recognize that channel strain is lost during finFET fabrication after an end fin cut is formed. Some embodiments of the present invention recognize using a lithography mask layer to facilitate the formation of an end fin cut. Embodiments of the present invention provide a semiconductor structure and process that prevents channel strain loss after the end fin is formed using a lithography mask layer. Embodiments of the present invention recognize that epitaxial growth of silicon germanium alloys during finFET fabrication results in poor control of the lateral thickness of the newly formed layer. Embodiments of the present invention provide a semiconductor structure and process that results in improved control of lateral source drain epitaxial growth in a finFET device. Embodiments of the present invention recognize that loss of channel strain is avoided by processing the end fin, which is cut after the gate formation module and during the MOL (middle of the line) module. Embodiments of the present invention recognize that lateral epitaxial layer shorts can be avoided with epitaxial growth through the MOL confined trench contact.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below in conjunction with FIGS. 1-12, embodiments may include methods of forming finFETs that have strained channel regions separating the source device from the drain device. The methods described below in conjunction with FIGS. 1-12 may be incorporated into typical semiconductor fabrication processes.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As used herein, terms such as "depositing", "forming", and the like refer to the disposition of layers or portions of materials in the present embodiments. Such processes may not be different than in the standard practice of the art of FET fabrication. Such practice include but are not limited to, metalorganic chemical vapor deposition (MOCVD), atomic layer deposition (ALD), chemical vapor deposition (CVD), low-pressure chemical vapor deposition (LPCVD), plasma enhanced chemical vapor deposition (PECVD), ultrahigh vacuum chemical vapor deposition (UHVCVD), physical vapor deposition, sputtering, plating, evaporation, ion beam deposition, electron beam deposition, laser assisted deposition, chemical solution deposition, or any combination of those methods.

As used herein, semiconductor structures refer to one or more physical structures that comprise semiconductor devices.

The present invention will now be described in detail with reference to the Figures.

FIG. 1 illustrates a top view depicting a structure that includes fins 6 and gate structures 5, in accordance with an exemplary embodiment of the present invention. Note that in this embodiment, the respective lengths of gate structures 5, denoted by double arrow 51 whose tips touch the opposite ends of gate structure 5 following its length, are shown as perpendicular to fins 6 in FIG. 1. Also note that the cross-section depicted occurs along the line 2-2 results in a cross section of the semiconductor structure of FIG. 1 having a cross section that includes the full length of a fin 6 but bisects each of gate structures 5 across their respective widths, which are perpendicular to double arrow 51 and run parallel to the length of fins 6 and line 2-2. This is further shown in FIG. 2 described later herein. Such orientations and descriptions are provided herein for ease of understanding and are not limiting. In some embodiments, true gate structures are introduced late in the fabrication and sacrificial gate structures are present at the stage depicted in FIG. 1. However, in other embodiments, true gate structures are introduced earlier in the fabrication. In those embodiments, the gate structures depicted in FIG. 1 are not sacrificial gate structures, but true gate structures. The formation of gate structures (both true and sacrificial) as embodied by FIG. 1 is well understood by those skilled in the art and, as such, a detailed description of such processes is not presented herein.

Figure 2:
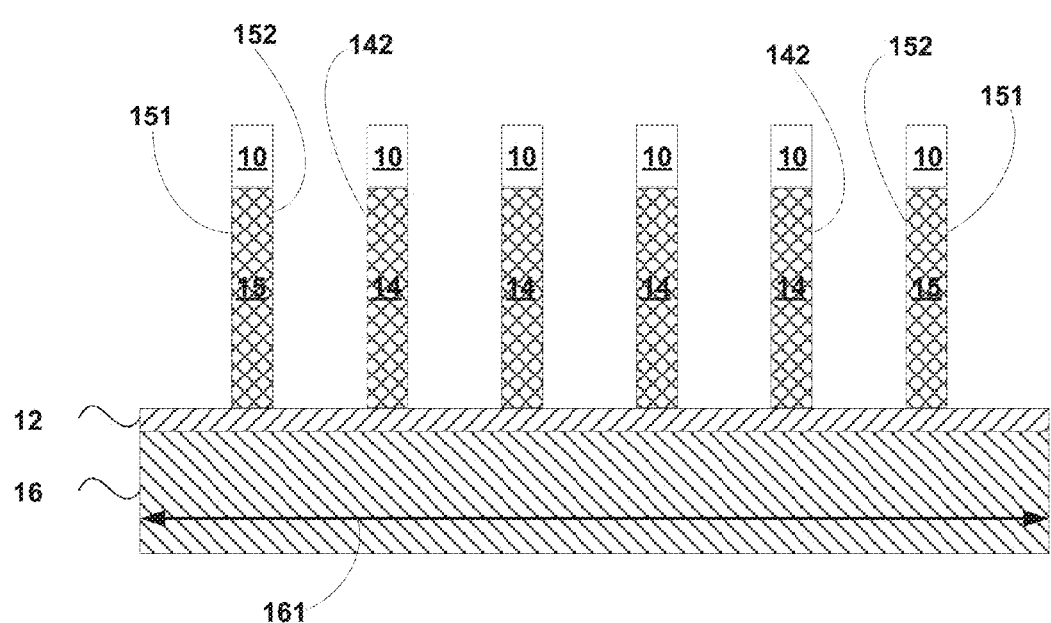
FIG. 2 illustrates a cross-sectional view depicting the structure of FIG. 1 that includes a fin and gate structures, in accordance with an exemplary embodiment of the present invention.

FIG. 2 illustrates a cross-sectional view taken about the line 2-2 of FIG. 1, in accordance with an exemplary embodiment of the present invention. FIG. 2 illustrates a cross-section through one fin and across all of the gate structures, in accordance with an exemplary embodiment of the present invention. FIG. 2 illustrates inner gates 14 and end gates 15.

As shown, each end gate 15 has an inner side surface 152 that faces an inner side surface 142 of an inner gate 14. Also note that each outer side surface 151 of each end gate 15 does not face an inner side surface 142. As such, as shown in FIGS. 1-12 an end fin cut refers to the removal of material that is adjacent to, but may not be directly abutting, an outer side surface 151 of an end gate 15. In the examples described herein, each outer side surface 151 defines a planar surface that provides a point of reference by which material is seen as being removed from the semiconductor structure. In some embodiments, one or more portions of material are removed such that a portion of material is left abutting outer side surface 151 while the one or more portions of material (which are further away from outer side surface 151 respective to the portion of material that is left abutting outer side surface 151) are removed. See FIG. 6 and its associated description for an example of such a removal of material.

The gate structures depicted in FIG. 2 include a top layer of hard mask 10. In this embodiment, hard mask 10 is composed of silicon nitride. In other embodiments, hard mask 10 is composed of any known material that is suitable for use as a hard mask. Directly beneath and in contact with hard mask 10 are inner gates 14 and end gates 15. In various embodiments, inner gates 14 and end gates 15 are sacrificial gates composed of silicon or any dielectric material suitable for use as a sacrificial gate material.

In other embodiments inner gates 14 and end gates 15 are true gates. In those embodiments, inner gates 14 and end gates 15 are composed of any conductive material including, for example, doped polysilicon with metal silicide, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof.

The fin 6 depicted in FIG. 2 includes gate dielectric layer 12 and channel 16. Note that gate dielectric layer 12 and channel 16 have a length denoted by double arrow 161. In various embodiments, channel 16 is composed of silicon (Si), silicon-germanium (SiGe), a combination of Si/SiGe/Si and another semiconducting layer such as a III-V compound semiconductor and/or a II-VI compound semiconductor, all of which serves to enhance the channel strain layer of channel 16. Gate dielectric layer 12 is in direct contact with and in between the gate structures and channel 16. Gate dielectric layer 12 provides an insulating layer separating channel 16 from inner gates 14 and end gates 15.

In various embodiments, gate dielectric layer 12 is composed of an insulator, typically $SiO_2$ or a high-κ dielectric metal oxide such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

Figure 3:
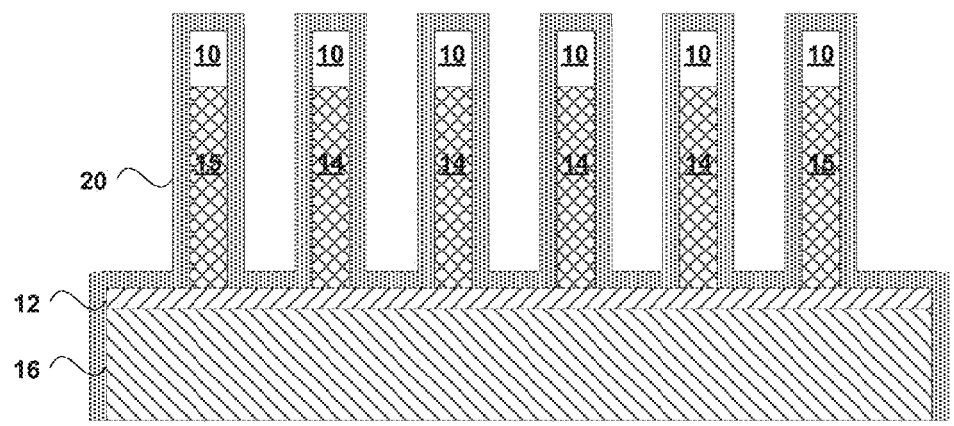
FIG. 3 illustrates a cross-sectional view depicting the formation of a spacer layer on the structure depicted in FIG. 2, in accordance with an exemplary embodiment of the present invention.

FIG. 3 illustrates a cross-sectional view depicting the formation of spacer layer 20 on the structure depicted in FIG. 2, in accordance with an exemplary embodiment of the present invention. As shown in FIG. 3, spacer layer 20 is in direct contact with hard mask 10, inner gates 14 and end gates 15, gate dielectric layer 12, and channel 16. The formation of spacer layers such as spacer layer 20 and as embodied by FIG. 3 is well understood by those skilled in the art and, as such, a detailed description of such processes is not presented herein. In various embodiments, spacer layer 20 is composed of a dielectric material such as silicon nitride, silicon dioxide, various well-known combinations of silicon, oxygen, boron, and nitrogen, and any dielectric layer whose dielectric constant value κ is less than 6.

Figure 4:
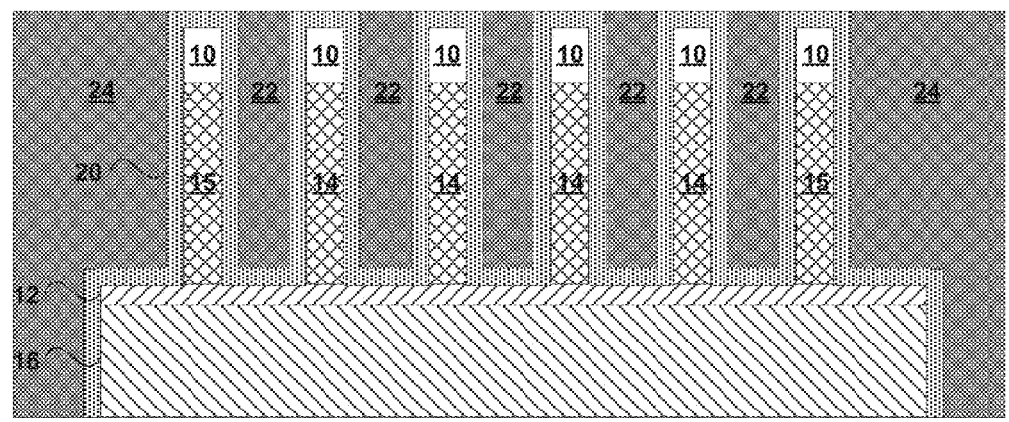
FIG. 4 illustrates a cross-sectional view depicting the formation of a middle of the line (MOL) inter-layer dielectric (ILD) layer on the structure depicted in FIG. 2, in accordance with an exemplary embodiment of the present invention.

FIG. 4 illustrates a cross-sectional view depicting the formation of a middle of the line (MOL) inter-layer dielectric (ILD) layer portions 24 (outside of end gates 15 to the left and to the right) and 22 (between the gate structures) on the structure depicted in FIG. 2, in accordance with an exemplary embodiment of the present invention. As shown in FIG. 4, MOL ILD layer portions 24 and 22 are in direct contact with space layer 20. In various embodiments, MOL ILD layer portions 24 and 22 are formed to a level higher than the level of the portion of spacer layer 20 residing on top of hard mask 10. A subsequent chemical-mechanical planarization (CMP) step produces a flat top surface substantially at the level of the portion of spacer layer 20 residing on top of hard mask 10 as represented in FIG. 4.

The formation of MOL ILD layers as embodied by MOL ILD layer portions 24 and 22 in FIG. 4 is well understood by those skilled in the art and, as such, a detailed description of such processes is not presented herein. In various embodiments, MOL ILD layer portions 24 and 22 are composed of a dielectric material (typically silicon dioxide), however, low-κ dielectric material (κ<4) can also be used to form MOL ILD layer portions 24 and 22.

Figure 5:
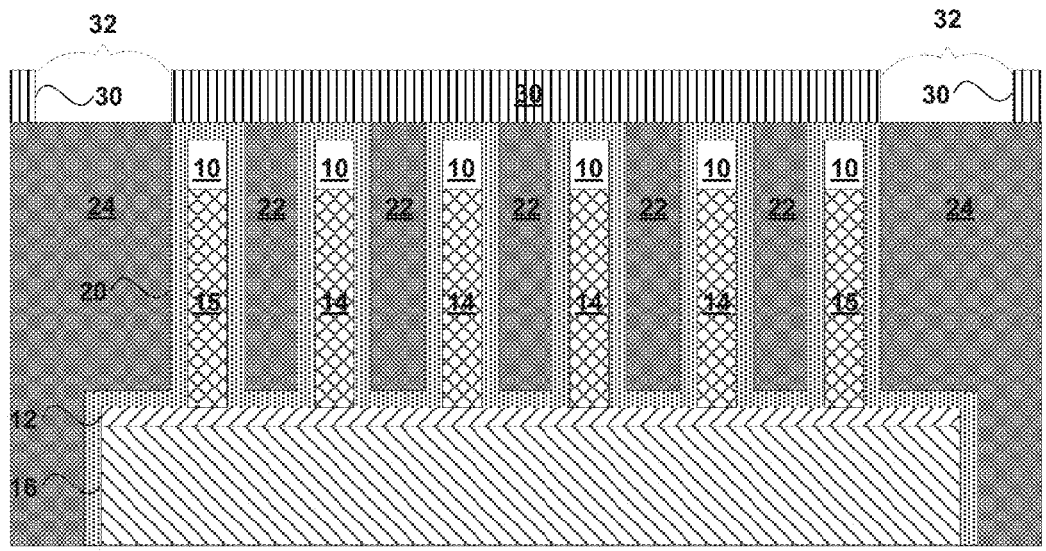
FIG. 5 illustrates a cross-sectional view depicting the formation of an end fin cut using a photo-resist patterning layer on the structure depicted in FIG. 4 and patterning of the photo-resist patterning layer, in accordance with an exemplary embodiment of the present invention.

FIG. 5 illustrates a cross-sectional view depicting the formation of a photo-resist patterning layer on the structure depicted in FIG. 4 and patterning of the photo-resist patterning layer using deep ultraviolet (DUV) or extreme ultraviolet (EUV) lithography exposure techniques to produce photo-resist patterned layer 30 and trenches 32, in accordance with an exemplary embodiment of the present invention. As shown in FIG. 5, photo-resist patterned layer 30 is on top and in direct contact with portions of spacer layer 20 residing on top of hard mask 10 and portions of photo-resist patterned layer 30 are on top and in direct contact with portions of MOL ILD layer portions 24 and 22. Trenches 32 expose portions of MOL ILD layer portions 24 for a subsequent RIE step. In various embodiments, photo-resist patterned layer 30 is a single, bi, or tri-layer. In exemplary embodiments, photo-resist patterned layer 30 is a tri-layer stack of optical deposition layers (ODL). Photo-resist patterned layer 30 is typically a carbon-containing organic spin-on material such as poly(methyl methacrylate) (PMMA), polymethylglutarimide (PMGI), etc. The formation of photo-resist patterning layers such as photo-resist patterned layer 30 as embodied by FIG. 5 is well understood by those skilled in the art and, as such, a detailed description of such processes is not presented herein.

Figure 6:
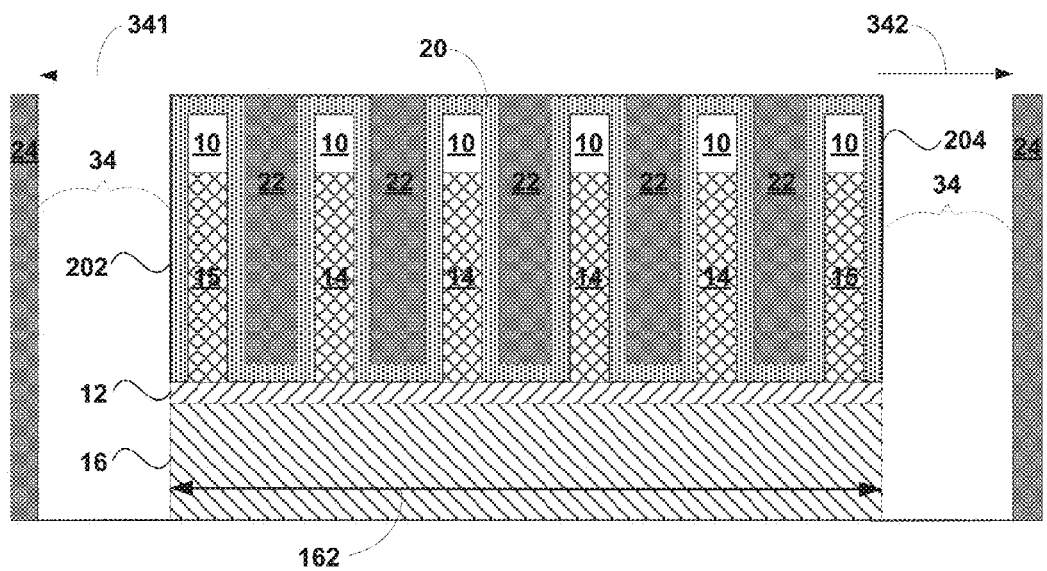
FIG. 6 illustrates a cross-sectional view depicting the removal of a portion of the ILD, spacer, gate dielectric, and fin layers in the structure depicted in FIG. 5 thereby creating trenches, in accordance with an exemplary embodiment of the present invention.
Figure 7:
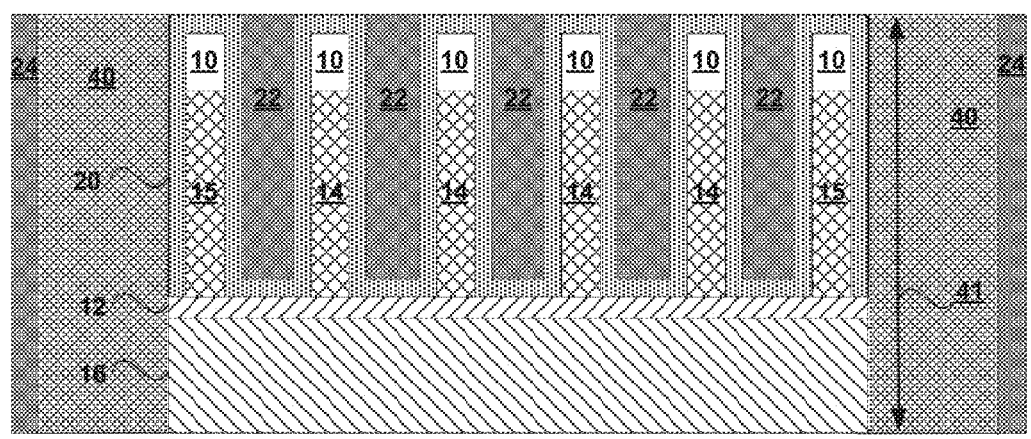
FIG. 7 illustrates a cross-sectional view depicting the deposition of a stress nitride within the trenches created in the structure depicted in FIG. 6, in accordance with an exemplary embodiment of the present invention.

FIG. 6 illustrates a cross-sectional view depicting the removal of portions of MOL ILD layer portions 24, spacer layer 20, gate dielectric layer 12, and fin layer 16 in the structure depicted in FIG. 5 thereby creating trenches, denoted using brackets 34, in accordance with an exemplary embodiment of the present invention. Note that the length of fin 6, which includes gate dielectric layer 12 and fin layer 16, is reduced in length. As such, the length of fin 6 shown in FIGS. 1-5 is reduced from the length indicated by double arrow 161 in FIG. 2 to the reduced length indicated by double arrow 162. In other words the length of fin 6 is reduced as a result of the removal of portions of MOL ILD layer portions 24, spacer layer 20, gate dielectric layer 12, and fin layer 16. In various embodiments, the portions of MOL ILD layer portions 24 are removed with reactive-ion etching (RIE) followed by fin etches to remove the portions of spacer layer 20, gate dielectric layer 12, and fin layer 16. Note that portions of spacer layer 20 that is abutting each outer side surface 151 of end gate 15 remain while material that is further away from outer side surface 151 is removed, thereby creating trenches 34. Note that the respective direction away from each end gate 15 is indicated by arrows labeled 341 and 342. Also note that two portions of spacer layer 20 that are covering outer side surface 151 are labeled as spacer side surface 202 and spacer side surface 204. Each of spacer side surface 202 and spacer side surface 204 respectively define a planar surface that provides a point of reference by which material is shown in the Figures as being removed from the semiconductor structure. In this example, material that is further away from spacer side surface 202 and spacer side surface 204, using arrows labeled 341 and 342 for orientation, is removed. Also note that the removal of material is limited to the areas defined by brackets 34. Note that the dimensions of each trench denoted by bracket 34 has an inherent width extending out and away from spacer its respective side surface 202 or spacer side surface 204 that coincides the width of each bracket 34. In other words, the width is perpendicular respective to respective side surface 202 or spacer side surface 204. The trench also has a height that is in plane with its respective spacer side surface 202 and spacer side surface 204. This height is indicated in FIG. 7 using double arrow 41 whose tips touch the opposite sides of stress nitride 40 in a direction that is parallel to side surface 202 and side surface 204. Note that the height of stress nitride 40 is substantially similar to the height of the trench since stress nitride 40 is formed in, i.e. fills, that trench. Note that, as in known to those skilled in the art, any suitable stress inducing material may be used in place of stress nitride 40 in some embodiments. In general, stress nitride 40 represents any suitable material that provides structural reinforcement such that the desired amount of strain is retained after an epitaxial growth of material between an inner gate 14 and an adjacent end gate 15. In the described embodiments, a channel of end gate 15 is under an initial amount of strain, which is relatively low in some embodiments. However, due to stress nitride 40 filling the trench, when a larger amount of strain is applied to the channel as a result of epitaxial growth of material between inner gate 14 and an adjacent end gate 15, the strain is retained, at least in part, as a result of the structural reinforcement provided by stress nitride 40. The result is that the channel of end gate 15 has an increased degree of strain when compared to its initial amount of strain.

FIG. 7 illustrates a cross-sectional view depicting the deposition of a stress nitride 40 within the trenches created in the structure depicted in FIG. 6, in accordance with an exemplary embodiment of the present invention. In various embodiments, stress nitride 40 is composed of silicon nitride. In the present embodiment, the deposition of stress nitride 40 is followed by CMP. In exemplary embodiments, the deposition of stress nitride 40 sets the stage for control of strain. Silicon nitride ($Si_3N_4$) can be tensile or compressive depending on deposition process. Deposition process techniques include but not limited to CVD (chemical vapor deposition) or ALD (atomic layer deposition) with and without plasma enhancement. Typically, tensile stress nitride 40 is used at the ends of fins for PFET devices so that compressive strain is produced on PFET channel. Compressive stress nitride 40 is used at the ends of fins for NFET devices so that tensile strain is produced on NFET channel. Stress nitride 40 thickness can range from 10 nm to 200 nm, i.e. the width of bracket 34, which corresponds to the width of the trench, is also 10 nm to 200 nm. Note that, in this embodiment, stress nitride 40 is adjacent to but not directly abutting end gate 15.

Figure 8A:
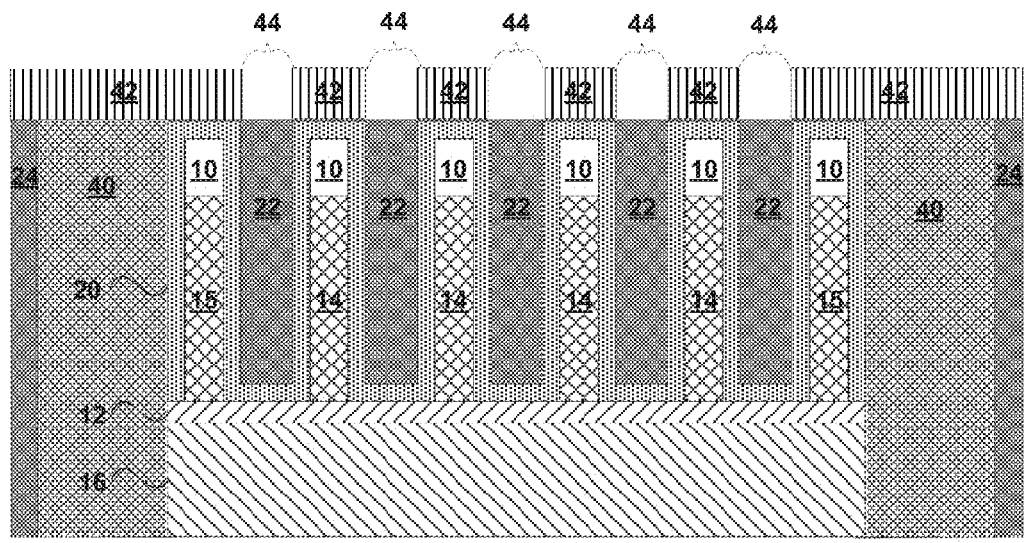
FIGS. 8A and 8B illustrate a cross-sectional view and a top-down view, respectively, depicting the photoresist patterning of trench contacts on the structure depicted in FIG. 7.
Figure 8B:
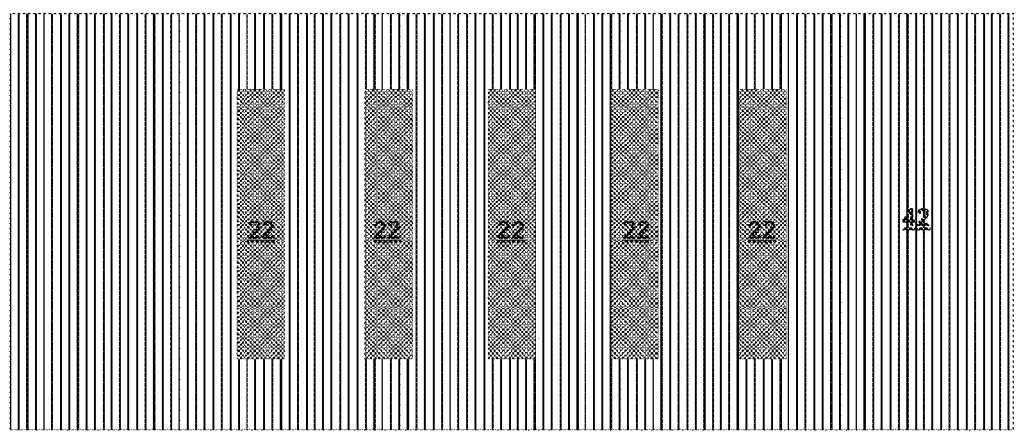

FIGS. 8A and 8B illustrate a cross-sectional view and a top-down view, respectively, depicting the photoresist patterning of trench contacts on the structure depicted in FIG. 7. Photo-resist patterned layer 42 is composed of silicon-containing anti-reflective coating (SiARC) or a low temperature oxide layer, which serves to control the critical dimension (CD) and opening profile during the formation of trenches 44. Trenches 44 are developed by DUV or EUV.

Figure 9:
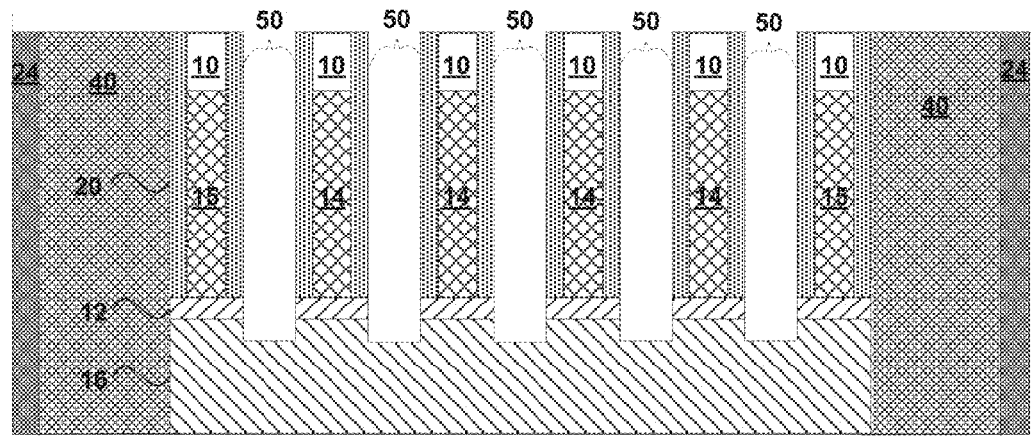
FIG. 9 illustrates a cross-sectional view depicting the removal of portions of the MOL ILD layer followed by reactive-ion etching, which removes portions of the gate dielectric and fin layers from the structure depicted in FIG. 8 thereby creating trenches, in accordance with an exemplary embodiment of the present invention.

FIG. 9 illustrates a cross-sectional view depicting the removal of MOL ILD layer portions 22 in between the gate structures followed by reactive-ion etching, which removes portions of gate dielectric layer 12 and fin layer 16 from the structure depicted in FIG. 8 thereby creating trenches 50, in accordance with an exemplary embodiment of the present invention.

Figure 10:
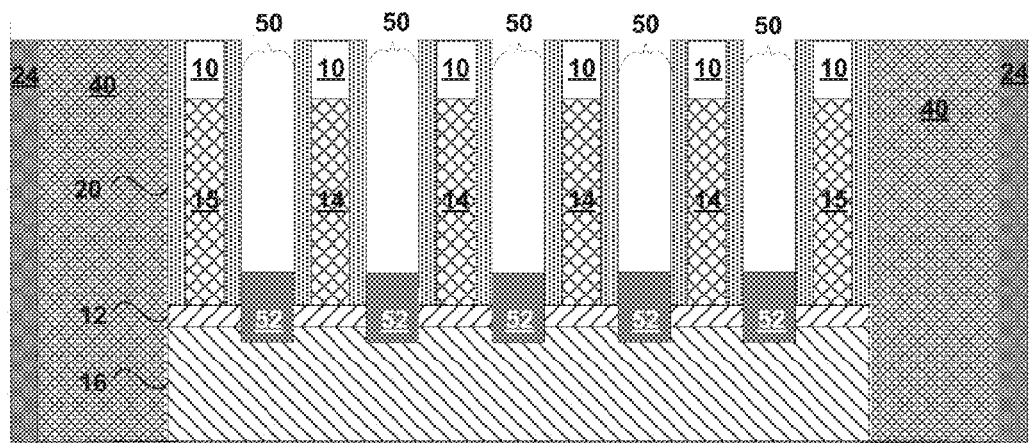
FIG. 10 illustrates a cross-sectional view depicting epitaxial growth within the trenches created in the structure depicted in FIG. 9, in accordance with an exemplary embodiment of the present invention.

FIG. 10 illustrates a cross-sectional view depicting silicon-germanium epitaxial growth 52 within the trenches 50 created in the structure depicted in FIG. 9, in accordance with an exemplary embodiment of the present invention. In exemplary embodiments, the desired strain is retained after the silicon-germanium epitaxial growth step in part because of the structural reinforcement provided by stress nitride 40.

Figure 11:
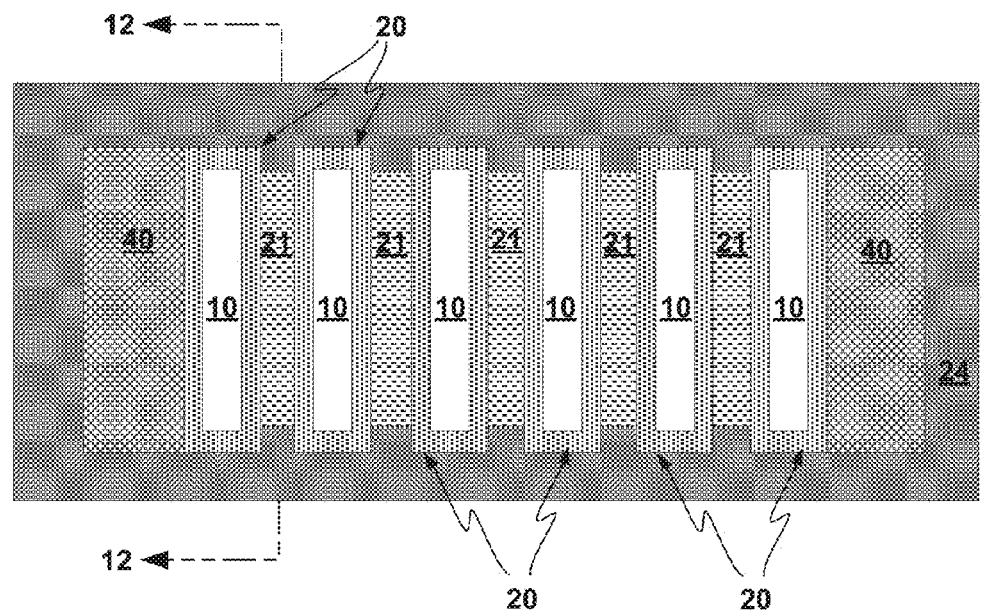
FIG. 11 illustrates a top-down view depicting the formation of contacts on top of the epitaxial growth layer created in the structure depicted in FIG. 10, in accordance with an exemplary embodiment of the present invention.

FIG. 11 illustrates a top-down view depicting the formation of contacts 21 on top of the epitaxial growth layer created in the structure depicted in FIG. 10, in accordance with an exemplary embodiment of the present invention.

The formation of contacts 21 involves a trench silicide/metallization/CMP process. The formation of contacts such as contacts 21 as embodied by FIG. 11 is well understood by those skilled in the art and, as such, a detailed description of such processes is not presented herein.

Figure 12:
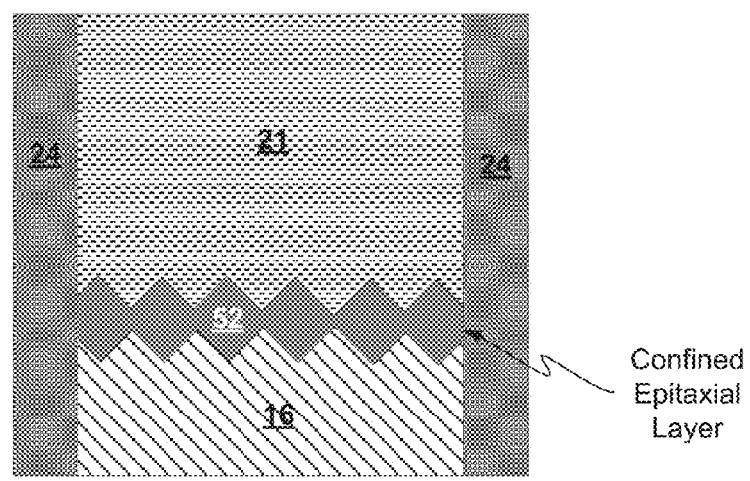
FIG. 12 illustrates a cross-sectional view illustrating the confinement of the epitaxial growth layer created in the structure depicted in FIG. 11, in accordance with an exemplary embodiment of the present invention.

FIG. 12 illustrates a cross-sectional view taken along line 12-12 of FIG. 11, in accordance with an exemplary embodiment of the present invention. FIG. 12 illustrates the confinement of epitaxial growth layer 52 in the structure depicted in FIG. 11. As depicted, the process described in embodiments of the present invention confine epitaxial growth layer between MOL ILD layer portions 24.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

The methods and structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

What is claimed is:

1. A method of forming a multi-gate finFET structure comprising:

depositing a stress-inducing material into a fin cut trench that is adjacent to an outer side of a first gate structure such that a channel, which is controlled by the first gate structure, has a first amount of strain, wherein the stress-inducing material fills a majority of the fin cut trench, wherein the stress-inducing material includes one or more of: a stress nitride layer, a tensile silicon nitride layer and a compressive silicon nitride layer, and wherein the channel includes one or more of: silicon, an alloy of silicon-germanium, a III-V compound semiconductor, and a II-VI compound semiconductor;

growing an epitaxial semiconductor layer between the first gate structure and a second gate structure, wherein the first amount of strain is increased to a second amount of strain as a result of the growth of the epitaxial semiconductor layer, wherein the epitaxial semiconductor layer is a silicon-germanium layer, wherein each of the first and second gate structures are one of: a sacrificial gate or a true gate, and wherein the first and second gate structures include silicon, doped polysilicon with metal silicide, tungsten, titanium, tantalum, aluminum, nickel, ruthenium, palladium, platinum, tungsten nitride, aluminum nitride, titanium nitride, tungsten silicide, nickel silicide, and titanium silicide;

forming the first gate structure, wherein the first gate structure includes an inner side and the outer side;

forming a second gate structure that is adjacent to the first gate structure such that the inner side of the first gate structure faces, at least in part, the second gate structure;

forming the fin cut trench that is adjacent to the outer side of the first gate structure;

forming the epitaxial semiconductor layer such that the epitaxial semiconductor layer fills, at least in part, an area between the first gate structure and the second gate structure.

* * * * *